United States Patent
Ishikawa (10) Patent No.: US 10,903,038 B2
(45) Date of Patent: Jan. 26, 2021

(54) CHARGED PARTICLE BEAM AXIAL ALIGNMENT DEVICE, CHARGED PARTICLE BEAM IRRADIATION DEVICE AND CHARGED PARTICLE BEAM AXIAL ALIGNMENT METHOD

(71) Applicant: Shimadzu Corporation, Kyoto (JP)

(72) Inventor: Takehiro Ishikawa, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 16/243,163

(22) Filed: Jan. 9, 2019

(65) Prior Publication Data
US 2019/0295806 A1 Sep. 26, 2019

(30) Foreign Application Priority Data
Mar. 26, 2018 (JP) ................... 2018-058281

(51) Int. Cl.
*H01J 37/14* (2006.01)
*H01J 37/147* (2006.01)
*H01J 37/22* (2006.01)
*H01J 37/26* (2006.01)
(Continued)

(52) U.S. Cl.
CPC ............ *H01J 37/14* (2013.01); *H01J 37/141* (2013.01); *H01J 37/1474* (2013.01); *H01J 37/1475* (2013.01); *H01J 37/222* (2013.01); *H01J 37/265* (2013.01); *H01J 37/28* (2013.01); *H01J 2237/141* (2013.01); *H01J 2237/1501* (2013.01); *H01J 2237/1504* (2013.01); *H01J 2237/24578* (2013.01)

(58) Field of Classification Search
USPC .................................................. 250/396 ML
See application file for complete search history.

(56) References Cited

U.S. PATENT DOCUMENTS 6,653,632 B2 * 11/2003 Kazumori ............... H01J 37/28
250/307
6,723,997 B2 * 4/2004 Matsuya ............. G01N 23/225
250/305
(Continued)

FOREIGN PATENT DOCUMENTS

JP 2007-303910 A 11/2007
JP 2011-054426 A 3/2011

OTHER PUBLICATIONS

Search Report dated Jan. 10, 2020 in corresponding European Application No. 19164468.1; 9 pages.

*Primary Examiner* — Phillip A Johnston
(74) *Attorney, Agent, or Firm* — Maier & Maier, PLLC (57) ABSTRACT

With strength of an objective lens set to first strength, a first scanned image of a sample is produced. The strength of the objective lens is set to second strength. A rotation amount difference of a charged particle beam between the case where the strength is set to the first strength and the case where the strength is set to the second strength is specified. At the second strength, with a scanner controlled such that the rotation for canceling the rotation amount difference is supplied to the charged particle beam, a second scanned image of the sample is produced. Based on a relative positional relationship between the first and second scanned images, a deflector is controlled such that positions of the first and second scanned images coincide with each other.

7 Claims, 5 Drawing Sheets

(51) Int. Cl.
*H01J 37/141* (2006.01)
*H01J 37/28* (2006.01)

(56) References Cited

U.S. PATENT DOCUMENTS

| 6,838,667 B2 * | 1/2005 | Tsuneta .................. H01J 37/21 |
| | | 356/401 |
| 7,026,614 B2 * | 4/2006 | Saitoh .................. H01J 37/153 |
| | | 250/307 |
| 2003/0116709 A1 | 6/2003 | Kazumori |

* cited by examiner

CHARGED PARTICLE BEAM AXIAL ALIGNMENT DEVICE, CHARGED PARTICLE BEAM IRRADIATION DEVICE AND CHARGED PARTICLE BEAM AXIAL ALIGNMENT METHOD

FIELD

The present invention relates to a charged particle beam axial alignment device, a charged particle beam irradiation device and a charged particle beam axial alignment method for aligning an axis of a charged particle beam.

BACKGROUND

A charged particle beam irradiation device has been known as a device for analysis or observation of a sample with high resolution. For example, in JP 2011-54426 A, an electron beam irradiation device that includes an electron gun, an inlet beam deflector, a converging lens system having two condenser lenses, an outlet beam deflector, an objective aperture plate, a scanning coil and an objective lens is described.

In the electron beam irradiation device, an electron beam emitted from the electron gun passes through the converging lens system to be converged. Then, the electron beam passes through the objective aperture plate, so that a beam diameter is restricted. Thereafter, the electron beam passes through scanning coils and is scanned in a plane, and the diameter of the electron beam is reduced to a small diameter when the electron beam passes through the objective lens. Then, a sample is irradiated with the electron beam. Secondary electrons, characteristic X-rays or the like are released from the sample irradiated with the electron beam and detected, whereby the sample is observed or analyzed.

The inlet beam deflector is used to align an axis of the electron beam such that the electron beam passes through the center of each condenser lens of the converging lens system. The outlet beam deflector is used to align the axis of the electron beam such that the electron beam passes through the center of the objective lens.

SUMMARY

In the axial alignment of the electron beam described in JP 2011-54426 A, the strength of the objective lens is changed while the electron beam is scanned by the scanning coils. Here, in the case where the electron beam does not pass through the center of the objective lens, when the strength of the objective lens is changed, the position irradiated with the electron beam on the sample is changed while rotating. As such, a user observes an objective wobbling image indicating the position irradiated with the electron beam, and adjusts the outlet beam deflector such that the change of a rotational center of the objective wobbling image is minimum.

However, it is not easy to accurately specify the rotational center of the objective wobbling image because the objective wobbling image is unclear. Therefore, depending on the skill of the user, the axis of the electron beam cannot be aligned with high accuracy. Further, it is necessary to repeat subtle adjustment of the outlet beam deflector, so that the axial alignment of the electron beam requires a long period of time.

An object of the present invention is to provide a charged particle beam axial alignment device, a charged particle beam irradiation device and a charged particle beam axial alignment method for enabling high-accuracy and high-efficiency alignment of an axis of a charged particle beam.

(1) A charged particle beam axial alignment device according to one aspect of the present invention that aligns an axis of the charged particle beam with an optical axis of the objective lens in a charged particle beam irradiation device that converges a charged particle beam by a magnetic field of an objective lens, irradiates a sample with the changed particle beam, allows a scanner to two-dimensionally scan the charged particle beam on a surface of the sample, deflects the charged particle beam by a deflector and can adjust a positional relationship between an axis of the charged particle beam and the optical axis of the objective lens includes a setter that sets magnetic field strength of the objective lens to first strength and second strength, a rotation amount difference specifier that specifies a difference in rotation amount of the charged particle beam between the case where the magnetic field strength is set to the first strength and the case where the magnetic field strength is set to the second strength as a rotation amount difference based on a difference in strength between the first strength and the second strength, a scanning controller that controls the scanner such that rotation for canceling the rotation amount difference specified by the rotation amount difference specifier is supplied to the charged particle beam, when the magnetic field strength is set to the second strength, a producer that produces a first scanned image based on charged particles produced from the sample when the magnetic field strength is set to the first strength, and produces a second scanned image based on charged particles produced from the sample when the magnetic field strength is set to the second strength, a positional relationship specifier that specifies a relative positional relationship between the first scanned image and the second scanned image, and a deflection controller that controls the deflector based on the positional relationship specified by the positional relationship specifier such that a position of the first scanned image and a position of the second scanned image coincide with each other.

In this charged particle beam axial alignment device, with the magnetic field strength of the objective lens set to the first strength, the first scanned image is produced based on the charged particles produced from the sample. Further, the magnetic field strength of the objective lens is set to the second strength. Based on the difference in strength between the first strength and the second strength, the rotation amount difference of the charged particle beam between the case where the electric field strength is set to the first strength and the case where the magnetic field strength is set to the second strength is specified. When the magnetic field strength is set to the second strength, the scanner is controlled such that the rotation for canceling the specified rotation amount difference is supplied to the charged particle beam. With the magnetic field strength set to the second strength, the second scanned image is produced based on the charged particles produced from the sample. The relative positional relationship between the produced first scanned image and the produced second scanned image is specified.

Here, the rotation amount difference of the charged particle beam generated due to the change in magnetic strength is canceled, so that the first scanned image and the second scanned image are not rotated with respect to each other, and it is not necessary to specify the rotational center of the rotation of the scanned image caused by the change in magnetic strength. Specifically, the relative positional relationship between the first scanned image and the second scanned image indicates the parallel transport. Therefore, regardless of the skill of the user, the relative positional relationship between the first scanned image and the second scanned image can be specified as the parallel transport amount with high accuracy and in a short period of time. The deflector is controlled based on the specified positional relationship such that the position of the first scanned image and the position of the second scanned image coincide with each other. As a result, the axis of the charged particle beam can be aligned with high accuracy and high efficiency.

(2) The charged particle beam axial alignment device may further include an image processor that performs an image process on the first and second scanned images, wherein the positional relationship specifier may specify a positional relationship between the first scanned image and the second scanned image based on a result of the image process by the image processor. In this case, the positional relationship can be specified using the whole of the first and second scanned images. Thus, the positional relationship between the first scanned image and the second scanned image can be specified with higher accuracy.

(3) The charged particle beam axial alignment device may further include a rotation information acquirer that acquires rotation information indicating a correspondence relationship between the magnetic field strength of the objective lens and the rotation amount of the charged particle beam, wherein the rotation amount difference specifier may specify the rotation amount difference of the charged particle beam based on the rotation information acquired by the rotation information acquirer. In this case, the rotation amount difference of the charged particle beam can be specified with ease and high efficiency.

(4) The charged particle beam axial alignment device may further include a deflection information acquirer that acquires deflection information indicating a correspondence relationship between the positional relationship, between the first scanned image and the second scanned image, and a deflection amount of the charged particle beam, and a deflection amount specifier that specifies a deflection amount of the charged particle beam for allowing the position of the first scanned image to coincide with the position of the second scanned image based on the deflection information acquired by the deflection information acquirer, wherein the deflection controller may control the deflector based on the deflection amount of the charged particle beam specified by the deflection amount specifier. In this case, the deflection amount of the charged particle beam can be specified with ease and high efficiency, and the deflector can be controlled.

(5) The charged particle beam axial alignment device may further include an acceptor that accepts designation of the magnetic field strength of the objective lens, wherein the setter may set the first strength and the second strength based on the magnetic field strength accepted by the acceptor. In this case, the deflection amount of the charged particle beam can be specified with ease and high efficiency, and the deflector can be controlled. The first strength and the second strength can be set to desired values.

(6) The setter may sets magnetic field strength that is lower than third strength by a predetermined value as one of the first strength and the second strength and sets magnetic field strength that is higher than the third strength by the predetermined value as another one of the first strength and the second strength, when the magnetic field strength of the objective lens in the case where a focal point of the objective lens coincides with the sample is defined as the third strength. In this case, the degree of blurriness of the first scanned image and the degree of blurriness of the second scanned image are equal to each other. Thus, the relative positional relationship between the first scanned image and the second scanned image can be specified more easily.

(7) A charged particle beam irradiation device according to another aspect of the present invention includes a charged particle source that produces a charged particle beam, an objective lens that converges the charged particle beam produced by the charged particle source by a magnetic field and irradiates a sample with the charged particle beam, a scanner that two-dimensionally scans the charged particle beam with which the sample is irradiated through the objective lens on a surface of the sample, a deflector that deflects the charged particle beam produced by the charged particle source to adjust a positional relationship between an axis of the charged particle beam and an optical axis of the objective lens, a detector that detects charged particles produced from the sample due to scanning of the charged particle beam on the surface of the sample, and a charged particle beam axial alignment device that aligns the axis of the charged particle beam with the optical axis of the objective lens, wherein the charged particle beam axial alignment device includes a setter that sets magnetic field strength of the objective lens to first strength or second strength, a rotation amount difference specifier that specifies a difference in rotation amount of the charged particle beam between the case where the magnetic field strength is set to the first strength and the case where the magnetic field strength is set to the second strength based on a difference in strength between the first strength and the second strength, a scanning controller that controls the scanner such that rotation for canceling the rotation amount difference specified by the rotation amount difference specifier is supplied to the charged particle beam, when the magnetic field strength is set to the second strength, a producer that produces a first scanned image based on charged particles detected by the detector when the magnetic field strength is set to the first strength, and produces a second scanned image based on charged particles detected by the detector when the magnetic field strength is set to the second strength, a positional relationship specifier that specifies a relative positional relationship between the first scanned image and the second scanned image, and a deflection controller that controls the deflector based on the positional relationship specified by the positional relationship specifier such that a position of the first scanned image and a position of the second scanned image coincide with each other.

In this charged particle beam irradiation device, the charged particle beam produced by the charged particle source is deflected by the deflector, whereby the positional relationship between the axis of the charged particle beam and the optical axis of the objective lens is adjusted. The charged particle beam is converged by the magnetic field of the objective lens and emitted to the sample, and is two-dimensionally scanned by the scanner on the surface of the sample. The charged particles produced from the sample due to the scanning of the charged particle beam on the surface of the sample is detected by the detector. Based on the detected charged particles, the operations of the objective lens, the scanner and the deflector are controlled by the charged particle beam axial alignment device. With the control of the charged particle beam axial alignment device, the axis of the charged particle beam can be aligned with high accuracy and high efficiency.

(8) A charged particle beam axial alignment method according to yet another aspect of the present invention for converging a charged particle beam by a magnetic field of an objective lens, irradiating a sample with the charged particle beam, allowing a scanner to two-dimensionally scan the charged particle beam on a surface of the sample, deflecting the charged particle beam by a deflector, and aligning an axis of the charged particle beam with an optical axis of the objective lens in a charged particle beam irradiation device that can adjust a positional relationship between the axis of the charged particle beam and the optical axis of the objective lens includes setting magnetic field strength of the objective lens to first strength, producing a first scanned image based on charged particles produced from the sample when the magnetic field strength is set to the first strength, setting the magnetic field strength of the objective lens to second strength, specifying a difference in rotation amount of the charged particle beam between the case where the magnetic field strength is set to the first strength and the case where the magnetic field strength is set to the second strength as a rotation amount difference based on a difference in strength between the first strength and the second strength, controlling the scanner such that rotation for canceling the specified rotation amount difference is supplied to the charged particle beam, when the magnetic field strength is set to the second strength, producing a second scanned image based on charged particles produced from the sample when the magnetic field strength is set to the second strength, specifying a relative positional relationship between the first scanned image and the second scanned image, and controlling the deflector based on the specified positional relationship such that a position of the first scanned image and a position of the second scanned image coincide with each other.

With this charged particle beam axial alignment method, the axis of the charged particle beam can be aligned with high accuracy and high efficiency.

Other features, elements, features, and advantages of the present invention will become more apparent from the following description of preferred embodiments of the present invention with reference to the attached drawings.

DETAILED DESCRIPTION

A charged particle beam axial alignment device (hereinafter abbreviated as an axial alignment device), a charged particle beam irradiation device including the axial alignment device and a charged particle beam axial alignment method according to an embodiment of the present invention will be described below in detail with reference to drawings. In the present embodiment, the charged particle beam irradiation device is an electron beam irradiation device for an EPMA (Electron Probe Micro Analyzer).

(1) Configuration of Charged Particle Beam Irradiation Device

Figure 1:
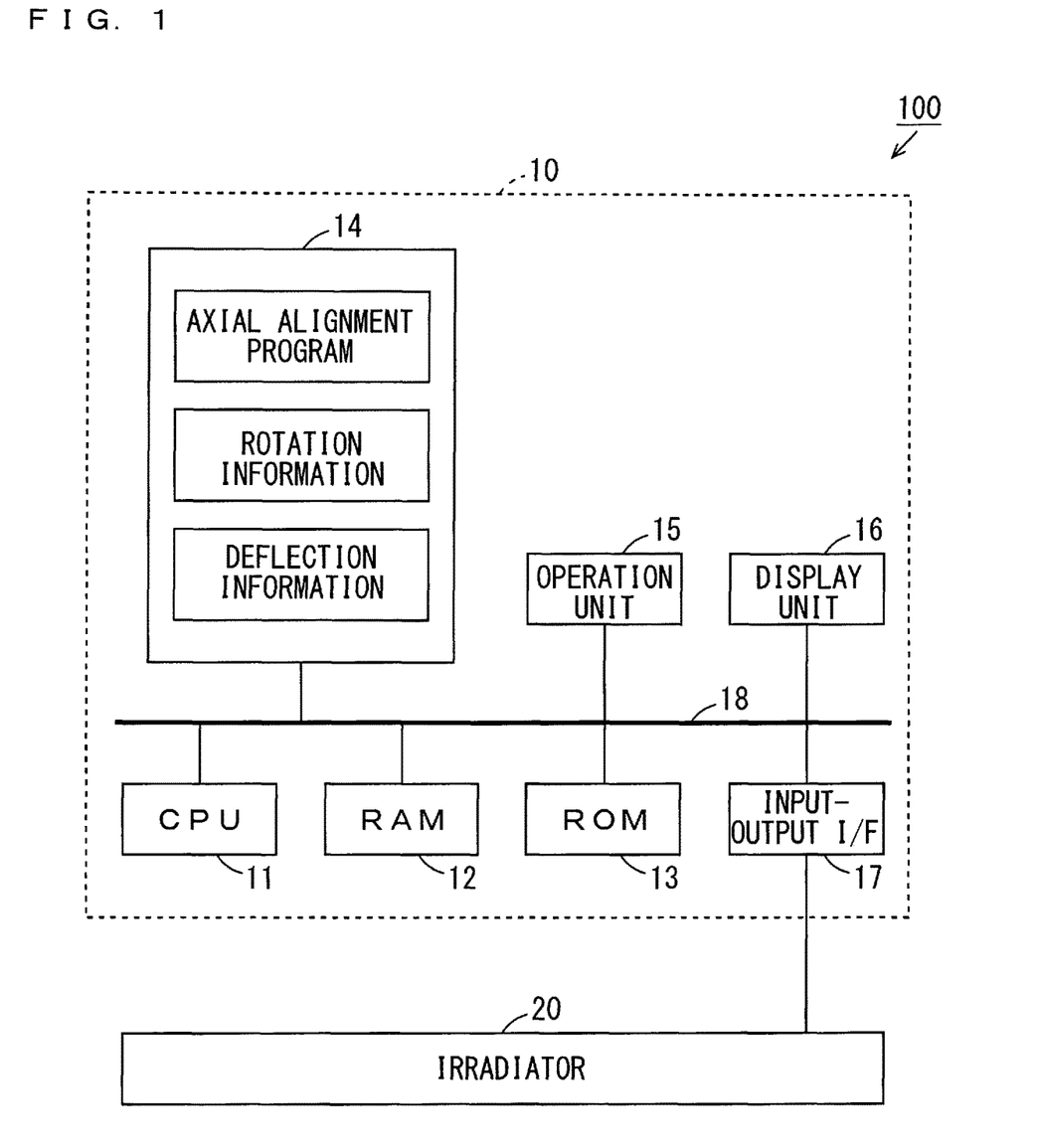
FIG. 1 is a diagram showing a configuration of a charged particle beam irradiation device according to one embodiment of the present invention.

FIG. 1 is a diagram showing a configuration of the charged particle beam irradiation device according to one embodiment of the present invention. In FIG. 1, the configuration of hardware of the charged particle beam irradiation device 100 is mainly shown. As shown in FIG. 1, the charged particle beam irradiation device 100 includes a processer 10 and an irradiator 20.

The processor 10 is constituted by a CPU (Central Processing Unit) 11, a RAM (Random Access Memory) 12, a ROM (Read On Memory) 13, a storage 14, an operation unit 15, a display unit 16, an input-output I/F (interface) 17. The CPU 11, the RAM 12, the ROM 13, the storage 14, the operation unit 15, the display unit 16 and the input-output I/F 17 are connected to a bus 18.

The RAM 12 is used as a work area for the CPU 11. A system program is stored in the ROM 13. The storage 14 includes a storage medium such as a hard disc or a semiconductor memory and stores an axial alignment program. The CPU 11 executes the axial alignment program stored in the storage 14 on the RAM 12, whereby an axial alignment process, described below, is performed.

The operation unit 15 is an input device such as a keyboard, a mouse or a touch panel. The display unit 16 is a display device such as a crystal liquid display device. A user can give various instructions to the below-mentioned axial alignment device using the operation unit 15. The display unit 16 can display a scanned image of a sample produced by the axial alignment device. The input-output I/F 17 is connected to an irradiator 20.

Figure 2:
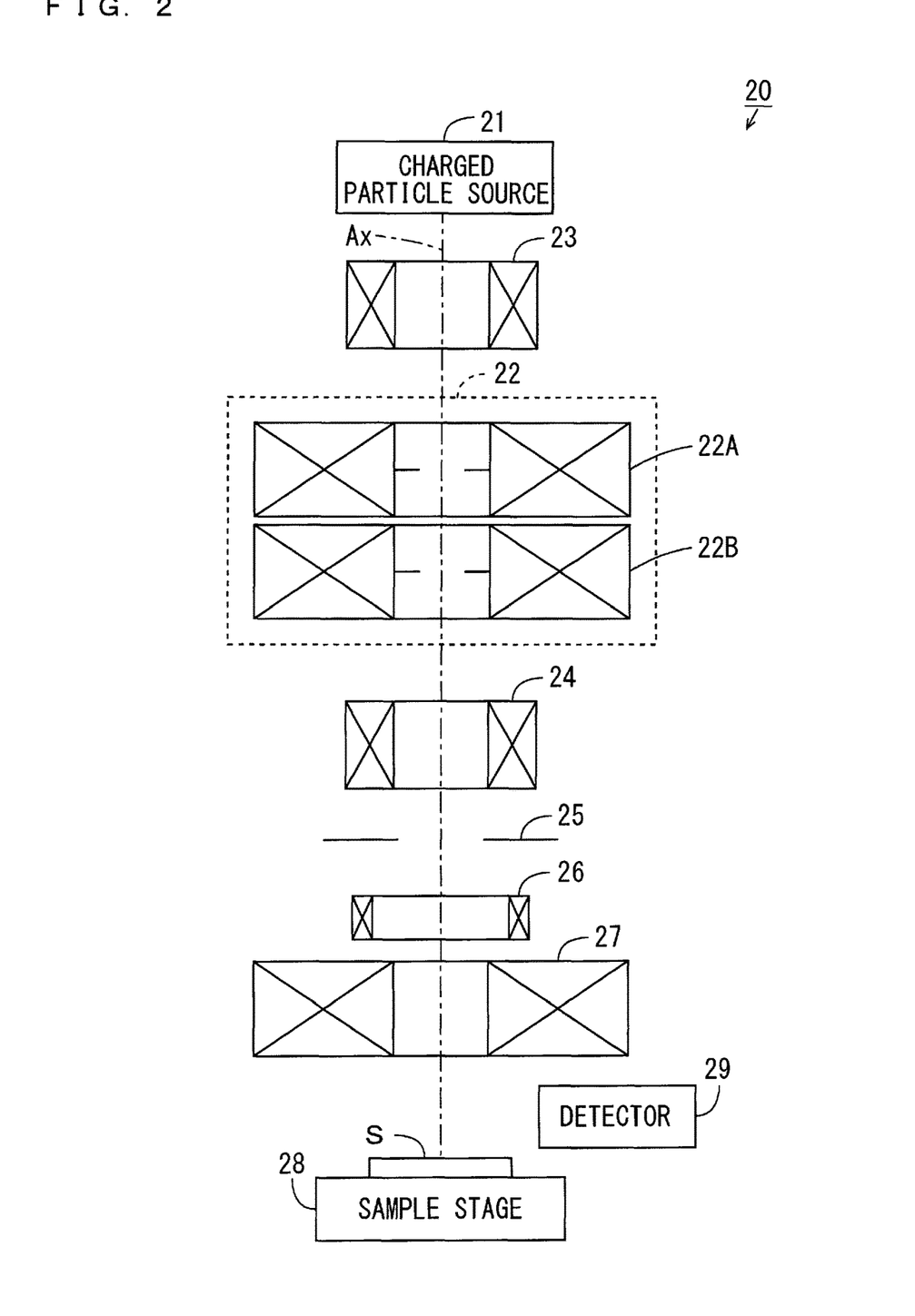
FIG. 2 is a diagram showing a schematic configuration of an irradiator of FIG. 1.

FIG. 2 is a diagram showing a schematic configuration of the irradiator 20 of FIG. 1. As shown in FIG. 2, the irradiator 20 includes a charged particle source 21, a converging lens 22, deflectors 23, 24, an objective aperture plate 25, a scanner 26, an objective lens 27, a sample stage 28 and a detector 29. Further, the irradiator 20 further includes a power source (not shown) for driving each of the charged particle source 21, the converging lens 22, the deflectors 23, 24, the scanner 26, the objective lens 27 and the detector 29. The operation of the power source is controlled by the processor 10.

The charged particle source 21 is an electron gun, for example, and emits an electron beam to the sample stage 28 as a charged particle beam. The deflector 23, the converging lens 22, the deflector 24, the objective aperture plate 25, the scanner 26 and the objective lens 27 are arranged in this order in an emission direction of the electron beam on an axis Ax connecting the charged particle source 21 to the sample stage 28.

The deflector 23 is constituted by alignment coils, for example, and deflects the electron beam in a plane perpendicular to the optical axis of the deflector 23. The deflector 23 may be constituted by two alignment coils that are arranged in a direction parallel to the axis Ax to be spaced apart from each other. The deflector 23 is adjusted such that the electron beam emitted from the charged particle source 21 passes through the center of each of condenser lenses 22A, 22B, described below.

The converging lens 22 is constituted by the condenser lenses 22A, 22B having a fixed relative positional relationship with each other. Each of the condenser lens 22A, 22B is adjusted such that the electron beam deflected by the deflector 23 converges at a focal point in front of the objective aperture plate 25.

The deflector 24 has the configuration similar to that of the deflector 23, and is adjusted such that the electron beam converged by the converging lens 22 passes through the center of the objective lens 27. The objective aperture plate 25 transmits the electron beam deflected by the deflector 24, thereby restricting an electric current of the electron beam.

The scanner 26 is constituted by scanning coils, for example, and two-dimensionally scans the electron beam that has passed through the objective aperture plate 25 in a plane perpendicular to the optical axis of the scanner 26. Further, the scanner 26 can rotate a scanning direction. The objective lens 27 is adjusted such that the electron beam scanned by the scanner 26 converges at a predetermined position.

A sample S that is to be analyzed or observed is placed on the sample stage 28. The electron beam that is two-dimensionally scanned by the scanner 26 and converged by the objective lens 27 is emitted to each portion of a surface of the sample S. The detector 29 is constituted by a reflective electron detector or a secondary electron detector, and detects electrons reflected from each portion of the surface of the sample S due to the irradiation with the electron beam or electrons (secondary electrons) released from each portion of the surface of the sample S due to the irradiation with the electron beam. The scanned image of the sample S is produced by the processor 10 of FIG. 1 based on the electrons detected by the detector 29.

The magnetic field strength (hereinafter simply referred to as strength) of the objective lens 27 is adjusted such that the electron beam is converged on the sample S placed on the sample stage 28. Here, when the strength is changed, the electron beam is rotated about the optical axis of the objective lens 27 by the angle corresponding to the change in strength. Therefore, when the electron beam does not pass through the center of the objective lens 27, the position irradiated with the electron beam on the sample S is changed while rotating. As such, the axial alignment device that adjusts the deflector 24 such that the electron beam passes through the center of the objective lens 27 is provided in the charged particle beam irradiation device 100.

(2) Axial Alignment Device

Figure 3:
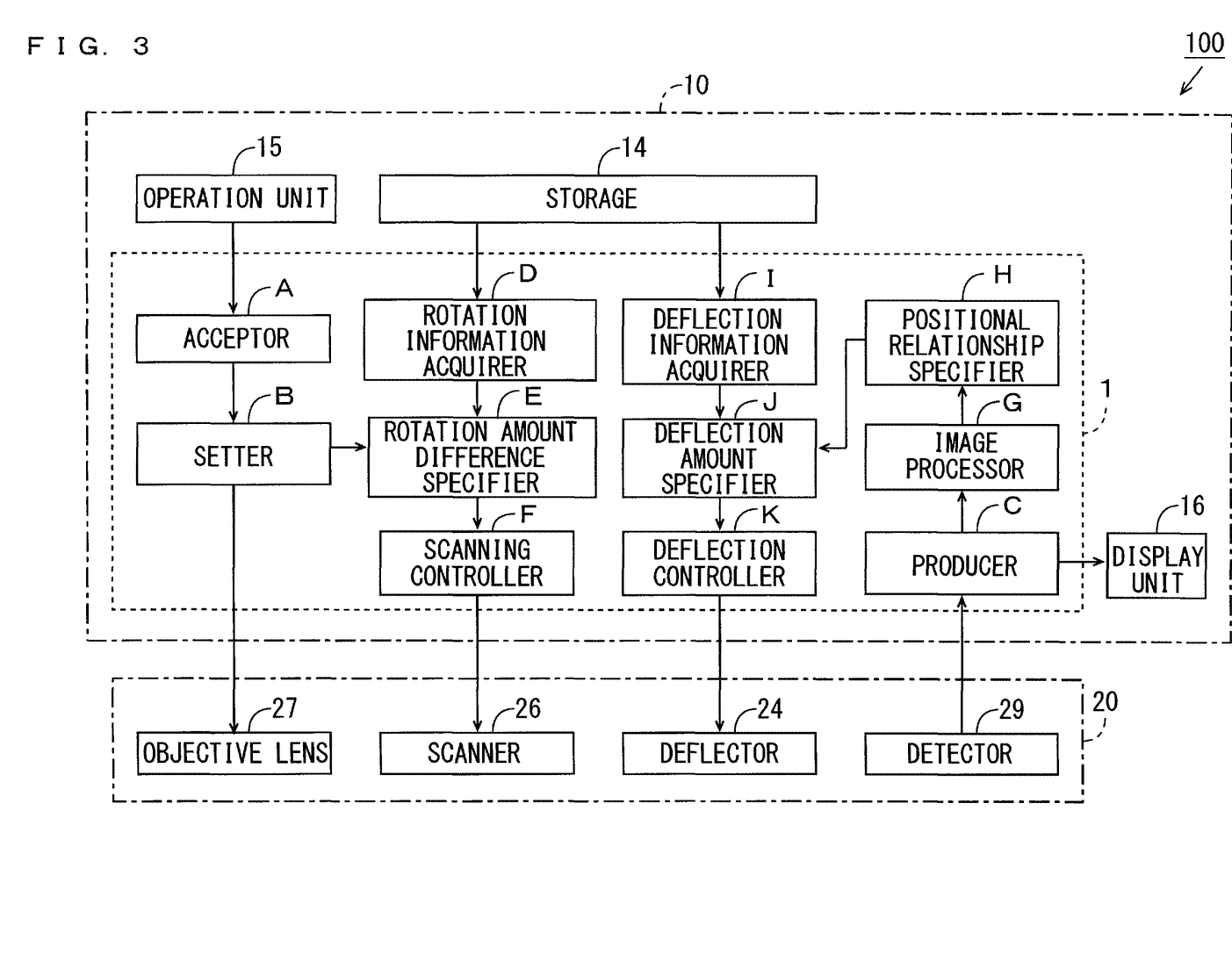
FIG. 3 is a diagram showing a configuration of an axial alignment device included in the charged particle beam irradiation device.

FIG. 3 is a diagram showing a configuration of the axial alignment device 1 included in the charged particle beam irradiation device 100. As shown in FIG. 3, the axial alignment device 1 includes an acceptor A, a setter B, a producer C, a rotation information acquirer D, a rotation amount difference specifier E, a scanning controller F, an image processor G, a positional relationship specifier H, a deflection information acquirer I, a deflection amount specifier J and a deflection controller K.

The CPU 11 of FIG. 1 executes the axial alignment program stored in the storage 14, whereby the functions of the constituent elements (A to K) of the axial alignment device 1 are implemented. Part or all of the constituent elements (A to K) of the axial alignment device 1 may be implemented by hardware such as an electronic circuit.

The acceptor A accepts designation of the strength of the objective lens 27 from the user. The user can designate desired strength by operating the operation unit 15. The setter B controls a driving source of the objective lens 27 such that the strength of the objective lens 27 is set to the strength accepted by the acceptor A. The producer C produces a scanned image of the sample S based on the electrons detected by the detector 29 and allows the display unit 16 to display the produced scanned image.

The rotation information indicating the correspondence relationship between the strength of the objective lens 27 and the rotation amount of the electron beam is stored in the storage 14 in advance. The rotation information may be produced by theoretical calculation based on the structure of the electron optical system, or may be produced based on an experiment. The rotation information acquirer D acquires the rotation information from the storage 14.

When the strength of the objective lens 27 is changed, the rotation amount difference specifier E specifies the difference between the rotation amounts of the electron beam respectively corresponding to the strength before the change and the strength after the change as a rotation amount difference based on the change amount of strength and the rotation information acquired by the rotation information acquirer D. The scanning controller F controls the scanner 26 based on the rotation amount difference of the electron beam specified by the rotation amount difference specifier E such that the rotation of the electron beam caused by the change in strength of the objective lens 27 is canceled. Specifically, the scanning controller F controls the driving source of the scanner 26 such that the scanning direction is rotated by the rotation amount difference specified by the rotation amount difference specifier E in the direction opposite to the direction of the rotation caused by the change in strength of the objective lens 27.

The image processor G performs an image process such as normalized cross-correlation on the scanned images before and after the change in strength. The positional relationship specifier H specifies the relative positional relationship between the scanned images before and after the change in strength based on a result of the image process performed by the image processor G. Specifically, the rotation of the electron beam is canceled by the scanner 26, so that the relative positional relationship between the scanned images before and after the change in strength indicates the parallel transport. The positional relationship specifier H specifies a parallel transport amount between the scanned images before and after the change in strength. Because the image process is performed on the scanned images before and after the change, the positional relationship specifier H can specify the parallel transport amount with high accuracy using the whole of the scanned images before and after the change. The parallel transport amount includes the parallel transport amount in two directions that are perpendicular to each other in a planar scanned image.

The deflection information indicating the correspondence relationship between the parallel transport amount of the scanned images and the deflection amount of the electron beam deflected by the deflector 24 is stored in the storage 14 in advance. The deflection information may be produced by theoretical calculation based on the structure of the electron optical system, or may be produced based on an experiment. The deflection information acquirer I acquires the deflection information from the storage 14.

The deflection amount specifier J specifies a deflection amount of the electron beam based on the parallel transport amount specified by the positional relationship specifier H and the deflection information acquired by the deflection information acquirer I. The deflection amount includes deflection amounts in the two directions that are perpendicular to each other in the plane perpendicular to the deflector 24. The deflection amounts in these two directions respectively correspond to the parallel transport amounts in the two directions that are perpendicular to each other in the above-mentioned scanned image.

The deflection controller K controls the driving source of the deflector 24 based on the electron beam deflection amount specified by the deflection amount specifier J such that the parallel transport of the scanned images is canceled. Thus, the electron beam passing through the deflector 24 passes through the center of the objective lens 27.

(3) Axial Alignment Process

Figure 4:
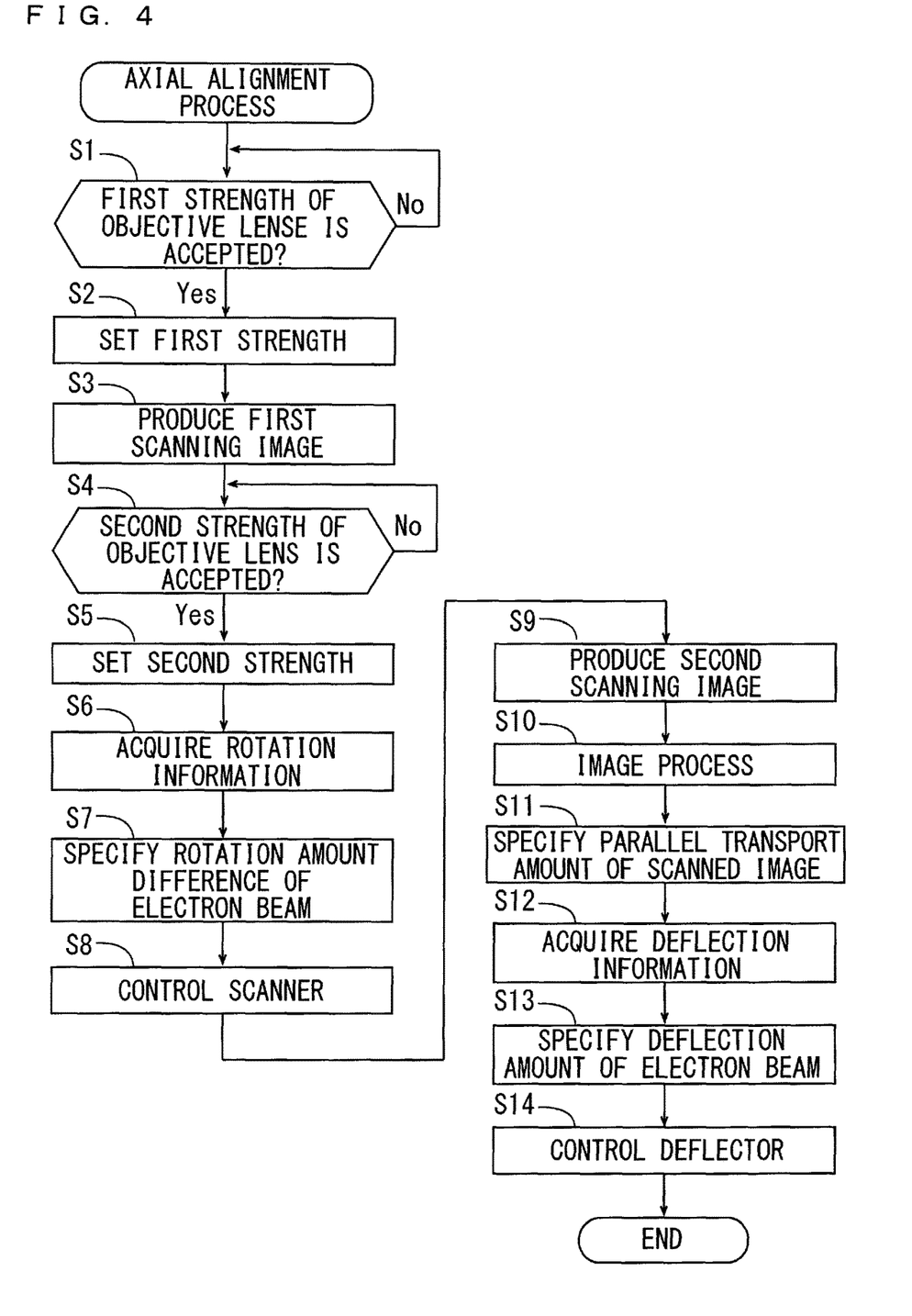
FIG. 4 is a flow chart showing the algorithm of an axial alignment process executed by an axial alignment program.

FIG. 4 is a flow chart showing the algorithm of the axial alignment process executed by the axial alignment program. FIGS. 5A to 5D are diagrams showing one example of the change of the scanned image in the axial alignment process. It is assumed that the electron beam passing through the deflector 24 does not pass through the center of the objective lens 27 before execution of the axial alignment process.

First, the acceptor A determines whether first strength is accepted as the strength of the objective lens 27 (step S1). When the first strength is not accepted, the acceptor A waits until the first strength is accepted. When the first strength is accepted, the setter B sets the strength of the objective lens 27 to the first strength (step S2).

Figure 5A:
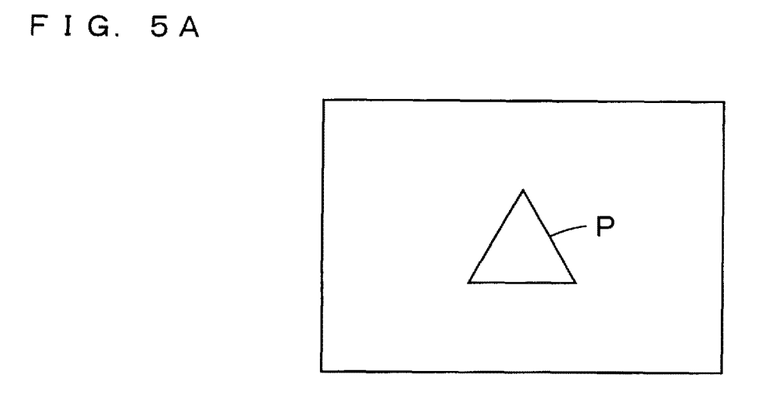
FIGS. 5A to 5D are diagrams showing one example of a change of a scanned image in the axial alignment process.

The producer C produces the scanned image at the first strength of the objective lens 27 as a first scanned image (step S3). The example of the first scanned image is shown in FIG. 5A. As shown in FIG. 5A, a feature portion P in the shape of an equilateral triangle appears in the first scanned image.

Next, the acceptor A determines whether second strength is accepted as the strength of the objective lens 27 (step S4). When the second strength is not accepted, the acceptor A waits until the second strength is accepted. When the second strength is accepted, the setter B sets the strength of the objective lens 27 to the second strength (step S5).

Figure 5B:
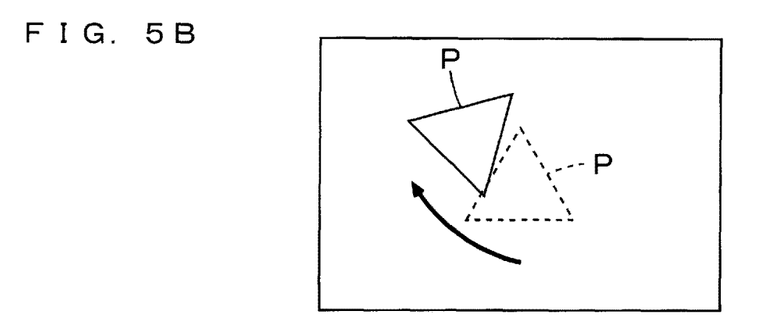

As indicated by a thick arrow in FIG. 5B, if the scanned image is produced in this state, a position of each portion is changed while each position is rotated. The example of FIG. 5B indicates the feature portion P before the change of the position (the feature portion P in the first scanned image) by a dotted line and the feature portion P after the change of the position by a solid line.

The rotation information acquirer D acquires the rotation information from the storage 14 (step S6). The rotation amount difference specifier E specifies a rotation amount difference of the electron beam based on the change amount of strength of the objective lens 27 and the rotation information acquired in the step S6 (step S7). The change amount of strength is the difference between the second strength set in the step S5 and the first strength set in the step S2 (or the preset first strength). The scanning controller F controls the scanner 26 based on the rotation amount difference of the electron beam specified in the step S7 such that the rotation of the electron beam is canceled (step S8).

Figure 5C:
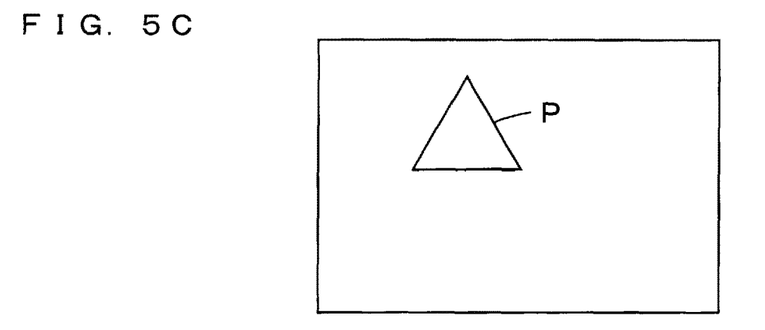

Thereafter, the producer C produces a scanned image at the second strength of the objective lens 27 as the second scanned image (step S9). Because the rotation of the electron beam is canceled, each portion of the second scanned image of FIG. 5C is not rotated as shown in FIG. 5B. Therefore, each portion of the second scanned image is parallel transported from each portion in the first scanned image.

Figure 5D:
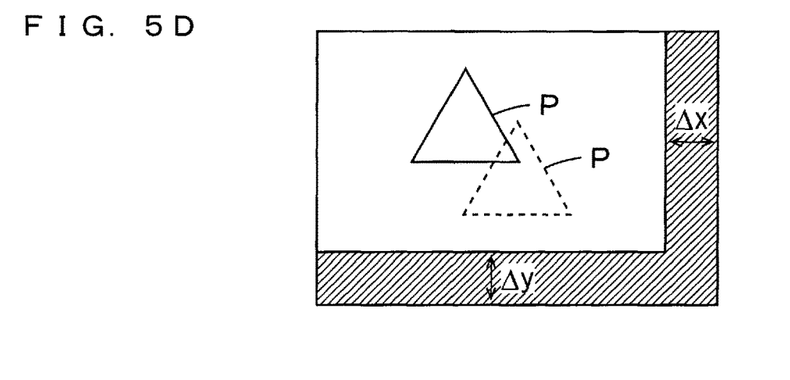

The image processor G performs an image process on the first and second scanned images produced in each of the steps S3 and S9 (step S10). The positional relationship specifier H specifies a parallel transport amount of the second scanned image with respect to the first scanned image based on a result of the image process in the step S10 (step S11). In FIG. 5D, the dotted line indicates the first scanned image overlapping with the second scanned image. Further, FIG. 5D shows the parallel transport amounts Δx, Δy in the two directions that are perpendicular to each other in the second scanned image.

The deflection information acquirer I acquires deflection information from the storage 14 (step S12). The deflection amount specifier J specifies a deflection amount of the electron beam based on the parallel transport amount specified in the step S11 and the deflection information acquired in the step S12 (step S13). The deflection controller K controls the deflector 24 based on the deflection amount of the electron beam specified in the step S13 such that the parallel transport of the second scanned image with respect to the first scanned image is canceled (step S14), and ends the axial alignment process.

Here, the strength of the objective lens 27 in the case where the focal point of the objective lens 27 coincides with the sample S is defined as third strength. In this case, in the step S1, the user preferably designates one of the strength that is lower than the third strength by a predetermined value and the strength that is higher than the third strength by the predetermined value as the first strength. Further, in the step S4, the user preferably designates the other one of the strength that is lower than the third strength by the predetermined value and the strength that is higher than the third strength by the predetermined value as the second strength.

With this designation, the degree of blurriness of the first scanned image produced in the step S3 and the degree of blurriness of the second scanned image produced in the step S9 are equal to each other. Thus, in the step S11, the relative positional relationship between the first scanned image and the second scanned image can be specified more easily.

(4) Effects

In the charged particle beam irradiation device 100 according to the present embodiment, with the strength of the objective lens 27 set to the first strength by the setter B, the first scanned image is produced by the producer C based on the electrons detected by the detector 29. Thereafter, the strength of the objective lens 27 is set to the second strength by the setter B. Based on a difference in strength between the first strength and the second strength, the rotation amount difference of the electron beam between the case where the strength is set to the first strength and the case where the strength is set to the second strength is specified by the rotation amount difference specifier E.

When the strength is set to the second strength, the scanner 26 is controlled by the scanning controller F such that the rotation for canceling the specified rotation amount difference is supplied to the electron beam. With the strength set to the second strength, the second scanned image is produced by the producer C based on the electrons detected by the detector 29. The relative positional relationship between the produced first scanned image and the produced second scanned image is specified by the positional relationship specifier H.

Here, although it is difficult to specify the rotational center when the rotational center is present out of the region of the scanned image, because the rotation amount difference of the electron beam caused by the change in strength is canceled, the first scanned image and the second scanned image are not rotated with respect to each other. Therefore, it is not necessary to specify the rotational center of the rotation of the scanned image caused by the change in strength. Specifically, the relative positional relationship between the first scanned image and the second scanned image indicates the parallel transport.

With this configuration, the relative positional relationship between the first scanned image and the second scanned image can be specified as the parallel transport amount with high accuracy and in a short period of time regardless of the skill of the user. Based on the specified positional relationship, the deflector 24 is controlled by the deflection controller K such that the position of the first scanned image and the position of the second scanned image coincide with each other. As a result, the axis of the electron beam can be aligned with high accuracy and high efficiency.

(5) Other Embodiments (a) While the charged particle beam is an electron beam in the above-mentioned embodiment, the present invention is not limited to this. The charged particle beam may be another charged particle beam such as an ion beam.

(b) While the axial alignment device 1 includes the acceptor A in the above-mentioned embodiment, the present invention is not limited to this. When the third strength is registered in the setter B in advance, the axial alignment device 1 does not have to include the acceptor A. In this case, the process of the step S1 and S4 is not performed. Therefore, the axial alignment of the charged particle beam can be more easily automated.

Specifically, in the step S2 of the axial alignment process, the setter B sets one of the strength lower than the third strength by the predetermined value and the strength that is higher than the third strength by the predetermined value as the first strength. Further, the setter B sets the other one of the strength lower than the third strength by the predetermined value and the strength that is higher than the third strength by the predetermined value as the second strength.

(c) While the axial alignment device 1 includes the image processor G in the above-mentioned embodiment, the present invention is not limited to this. When the relative positional relationship between the first scanned image and the second scanned image can be easily specified, the image process does not have to be performed on the first and second scanned images, and the axial alignment device 1 does not have to include the image processor G.

(d) While the axial alignment device 1 includes the rotation information acquirer D in the above-mentioned embodiment, the present invention is not limited to this. When the rotation amount difference specifier E can specify the rotation amount difference of the electron beam based on the change amount of strength of the objective lens 27 by calculation or the like, the axial alignment device 1 does not have to include the rotation information acquirer D.

(e) While the axial alignment device 1 includes the deflection information acquirer I and the deflection amount specifier J in the above-mentioned embodiment, the present invention is not limited to this. When the deflection amount specifier J can specify the deflection amount of the electron beam deflected by the deflector 24 based on the parallel transport amount of the scanned image by calculation or the like, the axial alignment device 1 does not have to include the deflection information acquirer I. Further, when the user determines a deflection amount, and the deflection controller K controls the deflector 24 based on the deflection amount determined by the user, the axial alignment device 1 does not have to include the deflection amount specifier J.

I claim:

1. A charged particle beam axial alignment device that aligns an axis of a charged particle beam with an optical axis of an objective lens in a charged particle beam irradiation device that converges the charged particle beam by a magnetic field of the objective lens, irradiates a sample with the changed particle beam, allows a scanner to two-dimensionally scan the charged particle beam on a surface of the sample, deflects the charged particle beam by a deflector and can adjust a positional relationship between the axis of the charged particle beam and the optical axis of the objective lens, comprising:
    a setter that sets magnetic field strength of the objective lens to first strength and second strength;
    a storage that stores, in advance, rotation information indicating a corresponding relationship between the magnetic field strength of the objective lens and a rotation amount of the charged particle beam;
    a rotation information acquirer that acquires the rotation information from the storage;
    a rotation amount difference specifier that specifies a difference in rotation amount of the charged particle beam between the case where the magnetic field strength is set to the first strength and the case where the magnetic field strength is set to the second strength as a rotation amount difference based on the rotation information acquired by the rotation information acquirer;
    a scanning controller that controls the scanner such that rotation for canceling the rotation amount difference specified by the rotation amount difference specifier is supplied to the charged particle beam, when the magnetic field strength is set to the second strength;
    a producer that produces a first scanned image based on charged particles produced from the sample when the magnetic field strength is set to the first strength, and produces a second scanned image based on charged particles produced from the sample when the magnetic field strength is set to the second strength;
    a positional relationship specifier that specifies a relative positional relationship between the first scanned image and the second scanned image; and
    a deflection controller that controls the deflector based on the positional relationship specified by the positional relationship specifier such that a position of the first scanned image and a position of the second scanned image coincide with each other.

2. The charged particle beam axial alignment device according to claim 1, further comprising an image processor that performs an image process on the first and second scanned images, wherein
    the positional relationship specifier specifies a positional relationship between the first scanned image and the second scanned image based on a result of the image process by the image processor.

3. The charged particle beam axial alignment device according to claim 1, further comprising:
    a deflection information acquirer that acquires deflection information indicating a correspondence relationship between the positional relationship, between the first scanned image and the second scanned image, and a deflection amount of the charged particle beam, and
    a deflection amount specifier that specifies a deflection amount of the charged particle beam for allowing the position of the first scanned image to coincide with the position of the second scanned image based on the deflection information acquired by the deflection information acquirer, wherein the deflection controller controls the deflector based on the deflection amount of the charged particle beam specified by the deflection amount specifier.

4. The charged particle beam axial alignment device according to claim 1, further comprising an acceptor that accepts designation of the magnetic field strength of the objective lens, wherein
the setter sets the first strength and the second strength based on the magnetic field strength accepted by the acceptor.

5. The charged particle beam axial alignment device according to claim 1, wherein
the setter sets the magnetic field strength that is lower than third strength by a predetermined value as one of the first strength and the second strength and sets the magnetic field strength that is higher than the third strength by the predetermined value as another one of the first strength and the second strength, when the magnetic field strength of the objective lens in the case where a focal point of the objective lens coincides with the sample is defined as the third strength.

6. A charged particle beam irradiation device comprising:
a charged particle source that produces a charged particle beam;
an objective lens that converges the charged particle beam produced by the charged particle source by a magnetic field and irradiates a sample with the charged particle beam;
a scanner that two-dimensionally scans the charged particle beam with which the sample is irradiated through the objective lens on a surface of the sample;
a deflector that deflects the charged particle beam produced by the charged particle source to adjust a positional relationship between an axis of the charged particle beam and an optical axis of the objective lens,
a detector that detects charged particles produced from the sample due to scanning of the charged particle beam on the surface of the sample; and
a charged particle beam axial alignment device that aligns the axis of the charged particle beam with the optical axis of the objective lens, wherein
the charged particle beam axial alignment device includes
a setter that sets magnetic field strength of the objective lens to first strength or second strength,
a rotation amount difference specifier that specifies a difference in rotation amount of the charged particle beam between the case where the magnetic field strength is set to the first strength and the case where the magnetic field strength is set to the second strength based on a difference in strength between the first strength and the second strength,
a scanning controller that controls the scanner such that rotation for canceling the rotation amount difference specified by the rotation amount difference specifier is supplied to the charged particle beam, when the magnetic field strength is set to the second strength,
a producer that produces a first scanned image based on charged particles detected by the detector when the magnetic field strength is set to the first strength, and produces a second scanned image based on charged particles detected by the detector when the magnetic field strength is set to the second strength,
a positional relationship specifier that specifies a relative positional relationship between the first scanned image and the second scanned image, and
a deflection controller that controls the deflector based on the positional relationship specified by the positional relationship specifier such that a position of the first scanned image and a position of the second scanned image coincide with each other.

7. A charged particle beam axial alignment method for converging a charged particle beam by a magnetic field of an objective lens, irradiating a sample with the charged particle beam, allowing a scanner to two-dimensionally scan the charged particle beam on a surface of the sample, deflecting the charged particle beam by a deflector, and aligning an axis of the charged particle beam with an optical axis of the objective lens in a charged particle beam irradiation device that can adjust a positional relationship between the axis of the charged particle beam and the optical axis of the objective lens, comprising:
setting magnetic field strength of the objective lens to first strength;
producing a first scanned image based on charged particles produced from the sample when the magnetic field strength is set to the first strength;
setting the magnetic field strength of the objective lens to second strength;
specifying a difference in rotation amount of the charged particle beam between the case where the magnetic field strength is set to the first strength and the case where the magnetic field strength is set to the second strength as a rotation amount difference based on a difference in strength between the first strength and the second strength;
controlling the scanner such that rotation for canceling the specified rotation amount difference is supplied to the charged particle beam, when the magnetic field strength is set to the second strength;
producing a second scanned image based on charged particles produced from the sample after the controlling of the scanner;
specifying a relative positional relationship between the first scanned image and the second scanned image; and
controlling the deflector based on the specified positional relationship such that a position of the first scanned image and a position of the second scanned image coincide with each other.

* * * * *